United States Patent [19]

Eda et al.

[11] Patent Number: 5,548,178
[45] Date of Patent: Aug. 20, 1996

[54] PIEZOELECTRIC VIBRATOR AND MANUFACTURING METHOD THEREOF

[75] Inventors: Kazuo Eda, Nara; Takashi Nagata, Ikeda, both of Japan

[73] Assignee: Matsushita Electric Industrial Co., Ltd., Osaka, Japan

[21] Appl. No.: 424,648

[22] Filed: Apr. 19, 1995

Related U.S. Application Data

[63] Continuation of Ser. No. 87,041, Jul. 7, 1993, abandoned.

[30] Foreign Application Priority Data

Jul. 8, 1992 [JP] Japan ................... 4-180856

[51] Int. Cl.⁶ ........................................ H01L 41/08
[52] U.S. Cl. ................. 310/349; 310/344; 310/346; 310/369
[58] Field of Search .................... 310/340, 344, 310/346, 348, 349, 361, 369, 347, 350

[56] References Cited

U.S. PATENT DOCUMENTS

| | | | |
|---|---|---|---|
| 2,133,647 | 10/1938 | Pierce | 310/350 |
| 2,229,172 | 1/1941 | Hawk | 310/350 |
| 2,427,825 | 9/1947 | Washburn | 310/350 |
| 3,239,908 | 7/1962 | Nakamura | 29/25.35 |
| 3,339,091 | 8/1967 | Hammond et al. | 310/349 |
| 3,694,677 | 9/1972 | Guttwein et al. | 310/369 |
| 4,135,108 | 1/1979 | Besson | 310/349 X |
| 4,141,209 | 2/1979 | Barnett et al. | 58/23 A |
| 4,270,105 | 5/1981 | Parker et al. | 310/340 X |
| 4,293,986 | 10/1981 | Kobayashi et al. | 29/25.35 |
| 4,317,059 | 2/1982 | Besson | 310/361 |
| 4,334,168 | 6/1982 | Besson et al. | 310/349 X |
| 4,398,114 | 8/1983 | Minagawa et al. | 310/313 R |
| 4,517,485 | 5/1985 | Berte et al. | 310/369 X |

(List continued on next page.)

FOREIGN PATENT DOCUMENTS

| | | |
|---|---|---|
| 0143686 | 6/1985 | European Pat. Off. . |
| 0503892 | 9/1992 | European Pat. Off. . |
| 0531985 | 3/1993 | European Pat. Off. . |
| 2458150 | 12/1980 | France . |
| 2516307 | 10/1976 | Germany . |
| 0156146 | 10/1985 | Germany . |
| 3922671 | 1/1991 | Germany . |
| 61-41215 | 2/1986 | Japan . |
| 0063107 | 4/1986 | Japan ................... 310/344 |

(List continued on next page.)

OTHER PUBLICATIONS

43rd Annual Symposium on Frequency Control—1989, "A New Design for High Frequency Bulk Resonators", A. Lepek et al., pp. 544–547.

"Fundamental–Mode VHF/UHF Miniature Acoustic Resonators and Filters on Silicon", Grudkowski et al., pp. 993–995, APPLIED PHYSICS LETTERS, vol. 37(11)(1980).

"Advances in Microwave Acoustic Frequency Sources" By Gerber et al., IIEE TRANSACTIONS ON MICROWAVE THEORY AND TECHNIQUES, V. MTT-34, No. 10, Oct. 1986.

"Direct–Frequency Crystal Oscillator Line Extends to 1.5 GHz", by Gallagher, ELECTRONICS/Jul. 14, 1981, pp. 7E & 8E.

"Silicon–to–Silicon Direct Bonding Method", by Shimbo et al., J. APPL. PHYS. (60(8), 15 Oct. 1986, pp. 2987–2989.

(List continued on next page.)

*Primary Examiner*—Mark O. Budd
*Attorney, Agent, or Firm*—Wenderoth, Lind & Ponack

[57] ABSTRACT

A piezoelectric vibrator includes a thin quartz plate portion for generating vibrations, and non-contact electrodes for applying an alternating electric field. The electrodes are arranged on opposing sides of the thin quartz plate portion so as to not contact with the thin quartz plate portion. The electrodes may be formed on a supporter which can be bonded directly to the thin quartz plate. The electrodes may also be formed above the thin quartz plate and supported by the plate outside the thin quartz plate portion. The piezoelectric vibrator has a superior Q of resonance at high frequencies.

17 Claims, 11 Drawing Sheets

U.S. PATENT DOCUMENTS

| | | | |
|---|---|---|---|
| 4,531,267 | 7/1985 | Royer | 29/25.35 |
| 4,539,501 | 9/1985 | Trong et al. | 310/313 A |
| 4,665,374 | 5/1987 | Fathimulla | 333/196 |
| 4,719,383 | 1/1988 | Wang et al. | 310/324 |
| 4,870,313 | 9/1989 | Hirama et al. | 310/369 X |
| 4,898,897 | 2/1990 | Kiyohara et al. | 523/343 |
| 4,945,079 | 7/1990 | Pedersen et al. | 502/314 |
| 5,036,241 | 7/1991 | Michaelis et al. | 310/358 |
| 5,075,641 | 12/1991 | Weber et al. | 331/108 |
| 5,185,589 | 2/1993 | Krishnaswamy et al. | 333/133 |
| 5,189,914 | 3/1993 | White et al. | 73/599 |
| 5,198,716 | 3/1993 | Godshall et al. | 310/349 |
| 5,448,126 | 9/1995 | Eda et al. | 310/344 X |
| 5,453,652 | 9/1995 | Eda et al. | 310/344 X |

FOREIGN PATENT DOCUMENTS

| | | | |
|---|---|---|---|
| 62-27040 | 6/1987 | Japan . | |
| 63-285195 | 11/1988 | Japan . | |
| 2-121512 | 5/1990 | Japan . | |
| 3-6912 | 1/1991 | Japan . | |
| 3-178206 | 2/1991 | Japan . | |
| 4-283957 | 10/1992 | Japan . | |
| 5-22071 | 1/1993 | Japan . | |
| 513471 | 5/1976 | U.S.S.R. | 310/344 |
| 510775 | 1/1977 | U.S.S.R. | 310/349 |
| 0580621 | 11/1977 | U.S.S.R. | 310/344 |

OTHER PUBLICATIONS

"Film Bulk Acoustic Waves Resonator Technology", by S. V. Krishnoswamy, et al. ULTRASONICS SYMPOSIUM, 1990, pp. 529–536 (1990).

"Zero–Temperature–Coefficient Saw Devices On AlN Epitaxial Films", K. Tsubouchi et al. IEEE Transactions, vol. SU–32, No. 5 (1985), pp. 634–644.

"A 400 HMz One–Chip Oscillator Using an Air–Gap Type Thin Film Resonator", by Satoh et al., IEEE Ultrsonics Symposim (1987), pp. 363–369.

"Generalized Bonding" by Goetz et al., 1989 IEEE SOS/SOI Technology Conference, Oct. 3–5, 1989, pp. 125–126.

PIEZOELECTRIC VIBRATOR AND MANUFACTURING METHOD THEREOF

This application is a Continuation of now abandoned application, Ser. No. 08/087,041, filed on Jul. 7, 1993 now abandoned.

BACKGROUND OF THE INVENTION

1. Field of the Invention

The present invention relates to a piezoelectric vibrator having good high frequency characteristics and a manufacturing method thereof.

2. Description of the Prior Art

Recently, communication devices have been made more compact and to operate at higher frequencies due to the development of mobile communication technology. These devices need vibrators and high frequency filters, and piezoelectric vibrators can be used for such vibrators and high frequency filters.

A prior art piezoelectric vibrator such as a quartz vibrator is prepared by forming a quartz plate of a prescribed shape and by forming electrodes on the top and bottom planes thereof. Vibrations are generated in the piezoelectric vibrator by applying an alternating electric voltage between the electrodes. A quartz vibrator having good characteristics at high frequencies is needed for mobile communication devices. Among high frequency characteristics, vibration frequency and Q of resonance (which is in correspondence to an inverse of loss) are important. The vibration frequency of a quartz vibrator is inversely proportional to the thickness of the quartz plate if thickness-shear vibration of quartz is used. Usually, a quartz vibrator which can be produced easily has a vibration frequency of 50 MHz or less in the fundamental mode and has a quartze plate with a thickness of 30 μm or more. In order to increase the vibration frequency, it is needed to reduce the thickness of the quartz plate. For example, the vibration frequency of 167 MHz can be available for a thickness of 10 μm, and the vibration frequency of 330 MHz can be available for a thickness of 5 μm. For example, E. A. Gerber et al. produces quartz vibrators for frequencies of hundreds of MHz to more than 1 GHz by using polishing, etching, ion trimming or the like ("Advances in Microwave Acoustic Frequency Sources", IEEE Transactions on Microwave Theory and Techniques, Vol. MTT-34, No. 10, October 1986, 1004). However, the Q of resonance decreases with increasing frequency. This is ascribed partly to the increase in electrode loss due to the skin effect at the electrodes. This is also ascribed to the weight of the electrode itself which contributes more loss with decreasing thickness. Then, there is an upper limit on the thickness of the electrode though the increase in thickness decreases the resistance of the electrode. Therefore, if quartz is formed to be thin with polishing or the like, the vibration frequency increases whereas the Q of resonance decreases, or a piezoelectric vibrator of good high frequency characteristics cannot be produced.

On the other hand, a quartz vibrator with a non-contact electrode is also known. For example, a quartz vibrator disclosed in Japanese Patent laid open Publication 2-121512/1990 intends to decrease temperature hysteresis. A quartz plate having a concave section is interposed and fixed between top and bottom plates on which an electrode is formed. Gaps are provided between the quartz plate and the electrodes. A specified metal (SUS 630) is used for metallic plates for holding the quartz plate, and the quartz plate is fixed with the metallic plates or holders with screws at a fixing angle of the quartz plate determined so that the thermal expansion coefficient of the metallic plates agrees with that of the quartz plate at the fixing angle. The thermal hysteresis decreases because the thermal expansion coefficient of the metallic plates is chosen to agree with that of the quartz plate. In the structure of the quartz vibrator, the effect of the mass of the electrodes on the vibration can be reduced so that Q at high frequencies can be improved. However, because screws are used, it is difficult to reproducibly provide a constant gap on the order of a micrometer order. If the gap cannot be adjusted at a high precision for a quartz plate of thickness of 10 μm or less, the stability of Q on production and on the characteristics under operation are not sufficient. Further, because screws are used, it is difficult to seal the vibration element in a compact size. The thermal expansion coefficient cannot agree only at a certain direction, and it is difficult to realize stability in a wide temperature range. The characteristics are liable to change if dropped or due to mechanical vibrations. It is also known to use an adhesive instead of screws to provide gaps and to fix the holders. However, an adhesive is an organic material and has a low heat-resisting property, and the characteristics may change for soldering at 220° C. or more and the temperature characteristics on use or on transport are not stable. Further, if the sealing is performed, gas may be generated from the adhesive and this may change the characteristics. A similar quartz vibrator is also disclosed in Japanese Patent laid open Publication 5-22071/1993, wherein a quartz plate and a pair of plates each having a non-contact electrode are fixed mechanically with screws.

Further, an elastic surface wave element disclosed in Japanese Patent laid open Publication 3-6912/1991 has a non-contact type electrode with a gap between the piezoelectric plate and the electrode. This element also uses the non-contact type electrodes like the present invention. However, the structure of the electrode is different from that of the present invention because an elastic surface wave is generated. Further, a bridge or supporter of the electrode is formed by using deposition on the piezoelectric plate, while the supporter of the electrode is bonded directly with the piezoelectric plate in the present invention.

SUMMARY OF THE INVENTION

An object of the present invention is to provide a quartz vibrator having a good Q at high frequencies.

A second object of the present invention is to provide a quartz vibrator which can be sealed in a compact size.

A third object of the present invention is to provide a quartz vibrator having good temperature characteristics.

A fourth object of the present invention is to provide a quartz vibrator stable against mechanical vibrations.

A fifth object of the present invention is to provide a quartz vibrator which can be produced in large quantities In one aspect of the invention, a piezoelectric vibrator comprises a piezoelectric plate made of quartz and including a thin plate portion and a pair of supporters, each of which supports an electrode. The supporters are bonded directly to the piezoelectric plate at the opposite sides thereof, and they have a shape in which a gap is provided between the thin plate portion of the piezoelectric plate and the electrode on the supporter. The thin plate portion of the piezoelectric plate is located near the electrodes without contact with the thin plate portion when the thin plate portion vibrates. Thus, the thin plate portion vibrates when an alternating electric field is generated by applying an alternating electric voltage between the two electrodes.

In a second aspect of the invention, a piezoelectric vibrator comprises a plate and a pair of electrodes. The plate comprises a thin plate portion made of quartz and a thick plate portion around the thin plate portion. The electrodes are arranged at the opposite side of the plate, and they are arranged above the thin plate portion and supported by the thick plate portion, and the thin plate portion is located near the electrodes without contact with the thin plate portion when the thin plate portion vibrates.

In a manufacturing method of a quartz vibrator, a plate including a thin plate portion made of quartz is provided. A material different from quartz is coated on the thin plate portion, and a metallic electrode is formed on the material. Then, the material is removed to form a gap between the metallic electrode and the thin plate portion. Such an electrode is formed above both sides of the thin plate portion. Then, the non-contact electrodes are arranged near the thin film portion for piezoelectric vibrations.

An advantage of the present invention is that it provides a piezoelectric vibrator having good Q of resonance at high frequencies.

Another advantage of the present invention is that it provides a piezoelectric vibrator haing good temperature characteristics.

A third advantage of the present invention is that a compact piezoelectric vibrator can be provided.

A fourth advantage of the present invention is that the mechanical stability of a piezoelectric vibrator can be improved.

A fifth advantage of the present invention is that the productivity of a piezoelectric vibrator can be improved.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
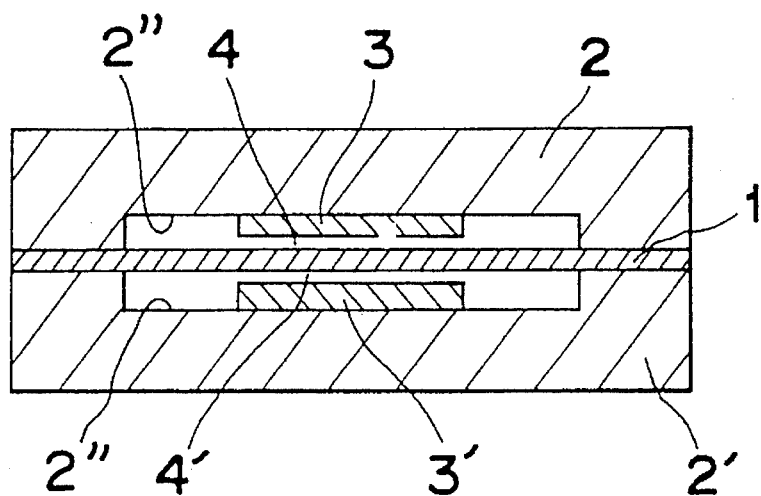
FIG. 1(a) is a sectional view of a first example of a piezoelectric vibrator of the present invention.

Referring now to the drawings, wherein like reference characters designate like or corresponding parts throughout the views, examples of structures and manufacturing methods of piezoelectric vibrators of the present invention will be explained below.

Embodiment 1

Figure 1B:
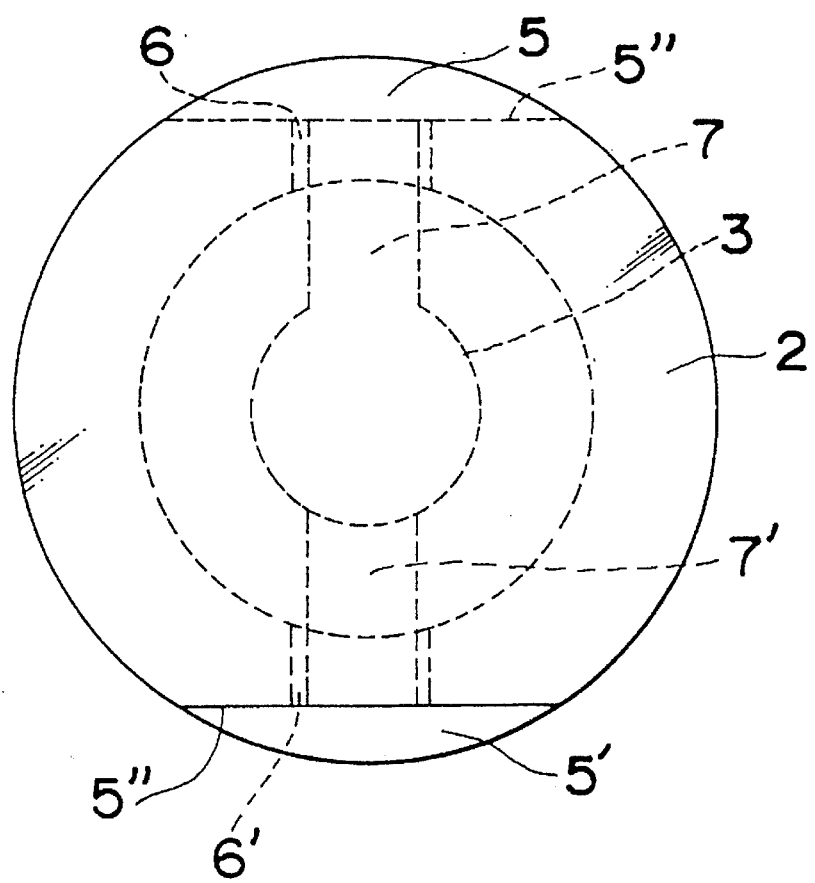
FIG. 1(b) is a plan view of the piezoelectric vibrator of FIG. 1(a)

FIGS. 1(a) and (b) show a first example of a piezoelectric vibrator. FIG. 1(a) shows a section of the structure of the piezoelectric vibrator and FIG. 1(b) is a top view of the structure shown in FIG. 1(a), wherein reference numeral 1 denotes a piezoelectric plate or a quartz plate for generating vibrations, and each of reference numerals 2, 2' denote a supporter of a non-contact electrode 3, 3', made of quartz or the like The quartz plate 1 is bonded directly with the supporters 2, 2' without an adhesive. Each of the supporters 2, 2' has a recess 2" at the center for receiving the electrode 3, 3', and another part (connection recess) 6, 6' having the same level as the recess 2" for connecting the electrode 3, 3' to the exterior. Thus, the part 6, 6' does not hinder the connection of connection portions 7, 7' to external electrodes 5, 5' which are provided for connection to an external circuit at the same level as the recess 2". The electrodes 3, 3' are opposed to each other via the quartz plate 1 and they are connected via connecting parts 7, 7' to the external electrodes. The connection parts 7, 7' of the electrodes, the external electrodes 5, 5' and the connecting recesses 6, 6' of the supporters 2, 2' extend from the center in opposite directions from each other, as shown in FIG. 1(b). Reference numerals 4, 4' denote gaps between the quartz plate 1 and the electrodes 3, 3'. The supporters 2 and 2' and the plate 1 have cut-out portions 5" in order to expose the surface for forming the external electrodes 5, 5'.

The electrodes 3, 3' do not contact directly with the vibrating portion at the center of the quartz vibration plate 1 due to the air gaps 4, 4' when the vibrating portion vibrates. Further, because the electrodes 3, 3' are provided near the vibration portion of the quartz plate 1, a strong electric field is applied to the quartz vibration portion when an electric field is applied between the top and bottom electrodes 3, 3'. By using this structure, a quartz vibrator of very good Q of resonance at high frequencies can be produced. For example, if the quartz plate 1 has 4 μm of thickness, the electrode 3, 3' has 2 μm of thickness and the gap 4, 4' has 1 μm of thickness, about 420 MHz of resonance frequency and Q of about 10,000 are realized. On the contrary, if the gaps 4, 4' are not provided, Q decreases to about 5,000. Thus, the loss at high frequencies can be significantly improved.

An example of a manufacturing method of the present invention will be explained below. First, a quartz plate of 40 μm of thickness is provided, and a portion which is to remain thick for handling is masked with a metallic film made of for example chromium-gold on both top and bottom planes. By using the mask, a portion of very thin thickness is formed at a part of the quartz plate with an etchant of hydrofluoric acid. By controlling the temperature and the time accurately on etching, the thin portion can be formed to have for example 4 µm of thickness. This thin portion is provided for the quartz plate 1 shown in FIG. 1(*a*). Next, quartz plates are provided, and by using a similar mask and a similar etching technique, quartz plates 2, 2' for supporting electrodes are produced which are thick at the periphery and thin at the center to form recesses 2". Similarly, connecting recesses 6, 6' and cut-out portions 5" are formed. Then, the masks are removed with an etchant for chromium-gold. The sizes of the quartz plates or supporters 2, 2' are as follows: The thickness at the periphery is 100 µm, while the thickness at the recess is 97 µm or it is concave by 3 µm in the recess 2". The recess 2" is circular and its diameter is for example 0.5 mm, and the total diameter is 1 mm by including the thick portion Next, electrodes 3, 3', 7, 7', 5, 5' for activating vibrations and for connecting to the exterior are formed on the supporters 2, 2' with ordinary vacuum deposition, photolithography, etching and lift-off techniques. The diameter of the electrodes 3, 3' for activation is for example 300 µm. The shapes of the recesses 2", 6, 6' are formed so as to be able to form an electrode for connection with the exterior. The electrodes 3, 3', 7, 7', 5, 5' are made of for example chromium-gold, and the thickness thereof is 2 µm. A pair of such electrode supporters 2, 2' are formed. Next, the surface of the quartz plate 1 and the quartz plates 2, 2' for supporting the electrodes are made hydrophilic. Specifically, the surface is rinsed lightly with hydrofluoric acid and it is immersed in pure water for several minutes. After the hydrophilic treatment, the quartz plate 1 is interposed between the two quartz plates 2, 2' so that the electrodes 3, 3' oppose each other. The planes in contact are adsorbed strongly with each other by hydroxyl groups adhered to the surface. Then, they are subjected to heat treatment. The water content is extracted gradually from the contact planes and oxygen and silicon atoms of constituent atoms of the quartz are bonded and the adhesion strength increases. The heat treatment temperature should be 100° C. or higher in order to improve the adhesion strength, and the adhesion strength increases with increasing heat treatment temperature. Actually, the heat treatment temperature is 300° to 500° C. Finally, the thick portion of the quartz plate retained for handling is removed, and a piezoelectric vibrator of a structure shown in FIGS. 1(*a*) and (*b*) can be obtained. That is, the thickness of the vibration portion is 4 µm, the thickness of the electrodes is 2 µm and the thickness of the gap is 1 µm. Therefore, a piezoelectric vibrator having a superior Q at high frequencies can be fabricated as shown in FIGS. 1(*a*) and (*b*).

Embodiment 2

Figure 2A:
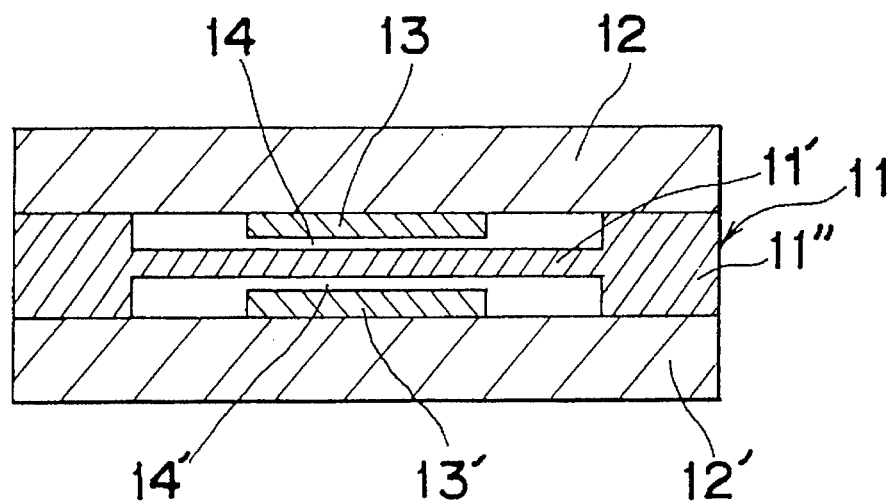
FIG. 2(a) is a schematic sectional view of a second example of a piezoelectric vibrator of the present invention.
Figure 2B:
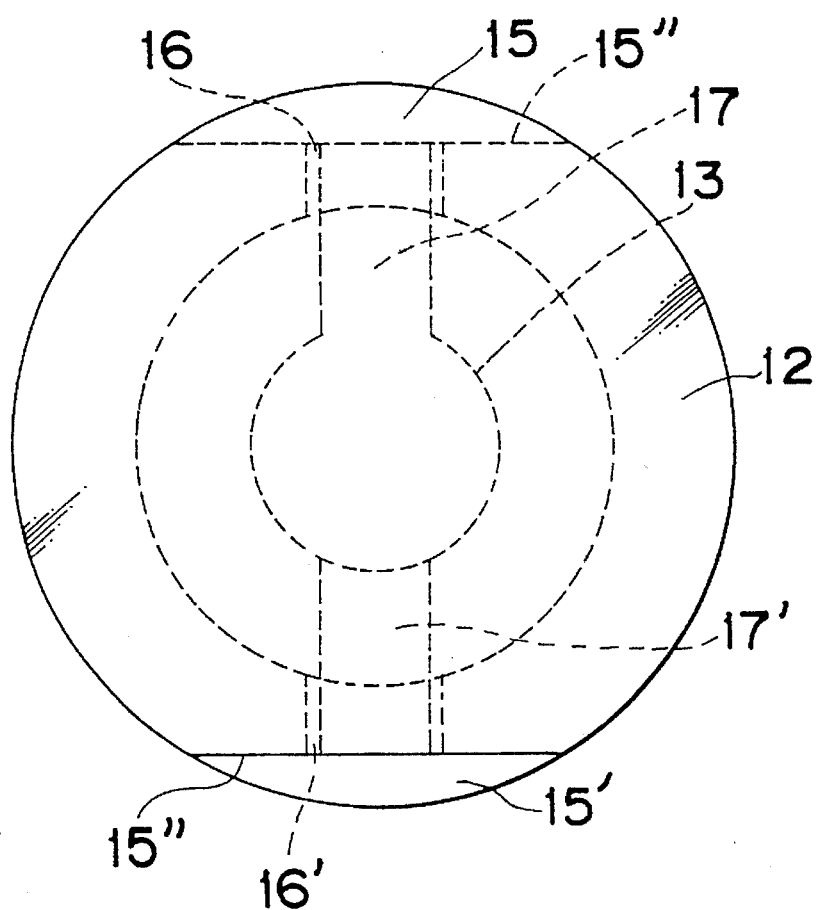
FIG. 2(b) is a plan view of the piezoelectric vibrator (of FIG. 2(a)

FIGS. 2(*a*) and (*b*) show a second example of a piezoelectric vibrator. FIG. 2(*a*) shows a section of the structure of the embodiment while FIG. 2(*b*) is a top view of the structure shown in FIG. 2(*a*), wherein reference numeral 11 denotes a quartz plate as a piezoelectric plate for generating vibrations, and reference numerals 12, 12' denote supporters of non-contact electrodes 13, 13' made of quartz or the like The electrodes 13, 13' are formed at the center of the supporters 12, 12'. The piezoelectric plate 11 is bonded directly with the supporters 12, 12' without an adhesive. The piezoelectric plate 11 includes a thin portion 11' for generating vibrations at the center and a thick portion 11" around the thin portion 11'. The piezoelectric plate 11 has concave parts (or connecting recesses) 16, 16' for connecting the electrodes 13, 13' via connection portions 17, 17' to external electrodes 15, 15' provided to be connected to an external circuit. The electrodes 13, 13' are opposed to each other with respect to the vibration portion 11' of the quartz plate 11 and they are connected via the connecting parts 17, 17' to the external electrodes. The connection parts 17, 17' of the electrodes, the external electrodes 15, 15' and the connecting recesses 16, 16' of the supporter 12, 12' extend from the center in opposite directions from each other, as shown in FIG. 2(*b*). The top and bottom supporters 12 and 12' and the piezoelectric plate 11 have cut-out portions 15" in order to expose the surface for forming the external electrodes 15, 15'. Reference numerals 14, 14' denote gaps between the quartz plate 11 and the electrodes 13, 13'.

The electrodes 13, 13' do not contact directly with the vibration portion 11' of the quartz plate 11 due to the gaps 14, 14', when the vibrating portion 11' vibrates Further, because the electrodes 13, 13' are provided near the vibration portion 11', a strong electric field is applied to the vibration portion 11' when an electric field is applied between the top and bottom electrodes 13, 13'. By using this structure, a quartz vibrator of very good Q of resonance at a high frequency can be produced. As an example, if the quartz plate 11 has 10 µm of total thickness by adding 4 µm for the upper and lower planes, the electrode 13, 13' has 2 µm of thickness and the gap 14, 14' has 1 µm of thickness, about 420 MHz of resonance frequency and Q of about 10,000 are realized. On the contrary, if the gaps are not provided, Q decreases to about 5,000. Thus, the loss at high frequencies can be significantly improved.

Next, an example of a manufacturing method is explained. First, a quartz plate of 40 µm of thickness is provided, and a portion 11 of 10 µm of thickness is fabricated as in the first method of Embodiment 1. Further, by repeating the same procedures, a thin portion 11' of 4 µm of thickness is formed in the thick portion 11 of 10 µm of thickness. The process explained in the first example of the manufacturing method in Embodiment 1 is carried out by using silicon wafer or glass instead of quartz for plates for supporting the electrodes. Next, the connection parts 16, 16' and the cut-out portions 15" are formed in a similar manner. Then, the electrodes 13, 13', 17, 17' and 15, 15' are formed on the supporters 12, 12'. Next, the surfaces of the quartz plate 11 and of the supporter 12, 12' are made hydrophilic, as in the first method. Then, the supporters 12, 12' are put on the quartz plate 11 so as to cause the electrodes 13, 13' to oppose one another via the thin portion 11'. Then, the heat treatment is performed. Therefore, a structure shown in FIGS. 2(*a*) and (*b*) can be produced, and good high frequency characteristics can be realized.

Embodiment 3

Figure 3A:
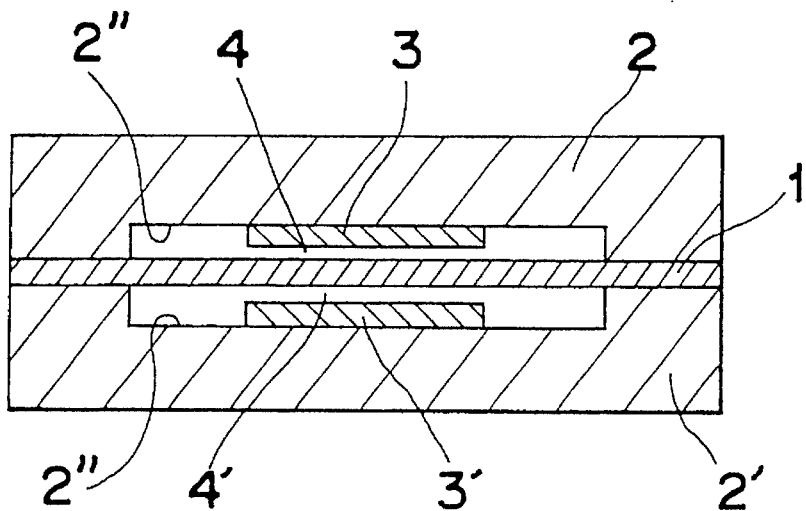
FIG. 3(a) is a schematic sectional view of a third example of a piezoelectric vibrator of the present invention.
Figure 3B:
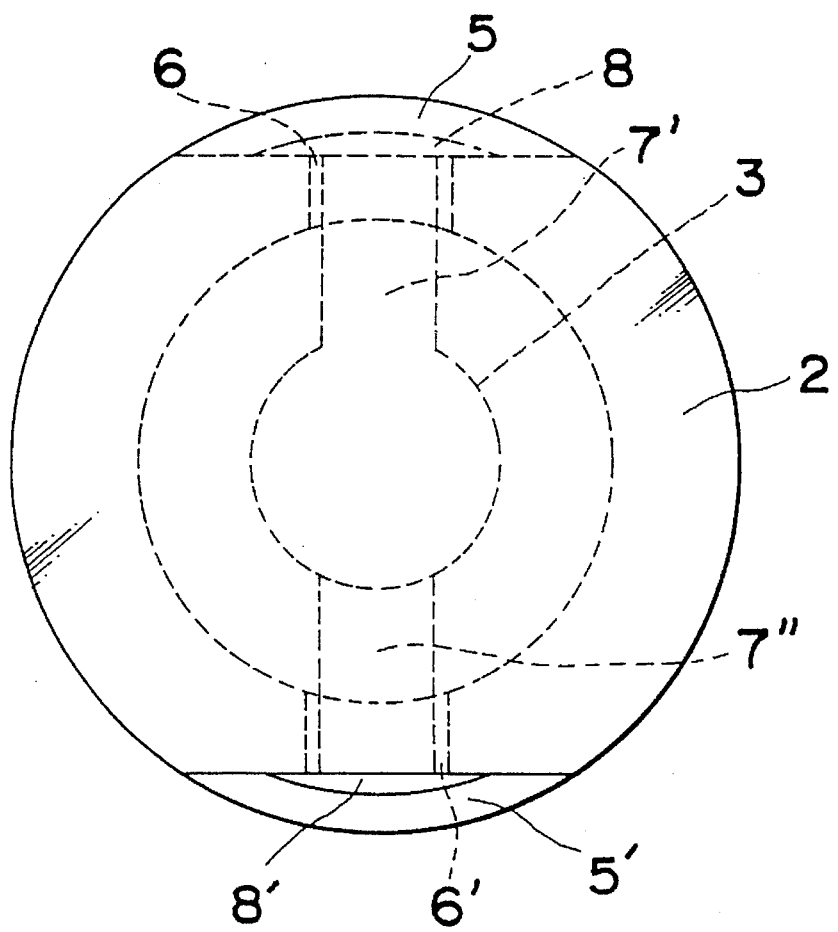
FIG. 3(b) is a plan view of the piezoelectric vibrator of FIG. 3(a)

FIGS. 3(*a*) and (*b*) show a third example of a piezoelectric vibrator wherein reference numerals 1–7 denote parts having names and functions similar to the piezoelectric vibrator shown in FIGS. 1(*a*) and (*b*). FIG. 3(*a*) shows a section of the structure of the embodiment while FIG. 3(*b*) is a top view of the structure shown in FIG. 3(*a*). In the piezoelectric vibrator shown in FIG. 3(*a*), a sealant 8, 8' of glass having a low melting point embeds in the openings of the connection recesses 6, 6' for connecting electrodes 7, 7' and this seals the vibration portion of the piezoelectric vibrator hermetically.

This electrode structure is similar to that of Embodiment 1, and the advantages of the electrodes 13, 13' are quite the same. Further, as explained above, the openings to the exterior are sealed with the glass sealant 8, 8' while the piezoelectric plate 1 and the supporters 2, 2' are sealed at the contact portions via direct bonding. Then, it can be said that the quartz vibrator is kept sealed by the direct bonding of the quartz plate 1 and the supporters 2, 2', together with the sealant 8, 8'. Thus, the vibration portion is sealed hermetically.

The melting point of the glass sealant 8, 8' may be selected to be 300°–500° C., and the direct bonding is performed at 300°–500° C. as mentioned above. Therefore, the characteristics of the vibrator is stable below this temperature, or the temperature characteristic is very stable.

Because an organic substance is not included inside the sealed structure, there is no gas generation in the inside due to secular change. By adopting this structure, the piezoelectric vibrator is stable against the environment for a long time. Previously, it was necessary to case encase a piezoelectric vibrator to seal it hermetically. However, with the above-mention structure, it is not necessary to further encase the vibrator in a case, so that the quartz vibrator can be made compact.

Next, an example of a manufacturing method is explained. First, the processes as explained in Embodiment 1 are carried out to form the structure of the piezoelectric vibrator shown in FIGS. 1(a) and (b). Then, the piezoelectric vibrator is put in a nitrogen or inert gas environment, and the recesses 6, 6' open to the exterior are filled with a glass of low melting point. Because the direct bonding and the sealing with a sealant provides good air tightness, the vibration portion can be sealed hermetically.

Further, the structure as illustrated in FIGS. 2(a) and (b) can also be sealed at the openings of portions 16, 16' for connecting the electrodes to the exterior with a glass of low melting point, and similar advantages can be realized.

Embodiment 4

Figure 4A:
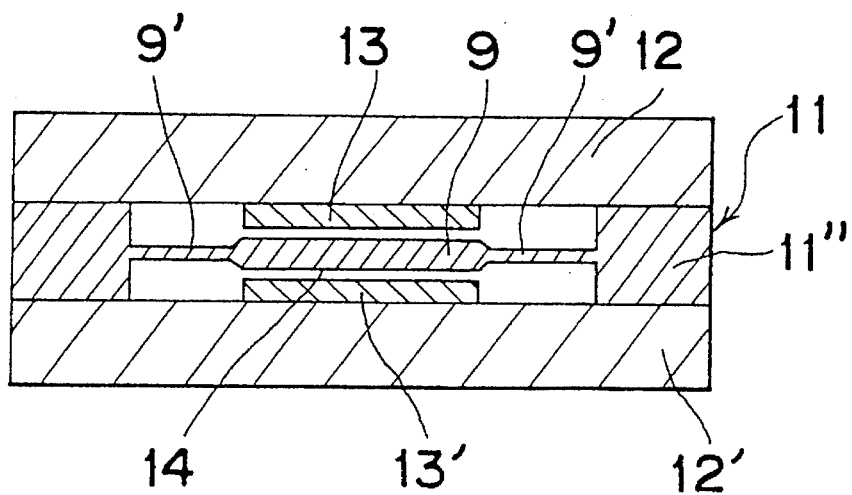
FIG. 4(a) is a schematic sectional view of a fourth example of a piezoelectric vibrator of the present invention.
Figure 4B:
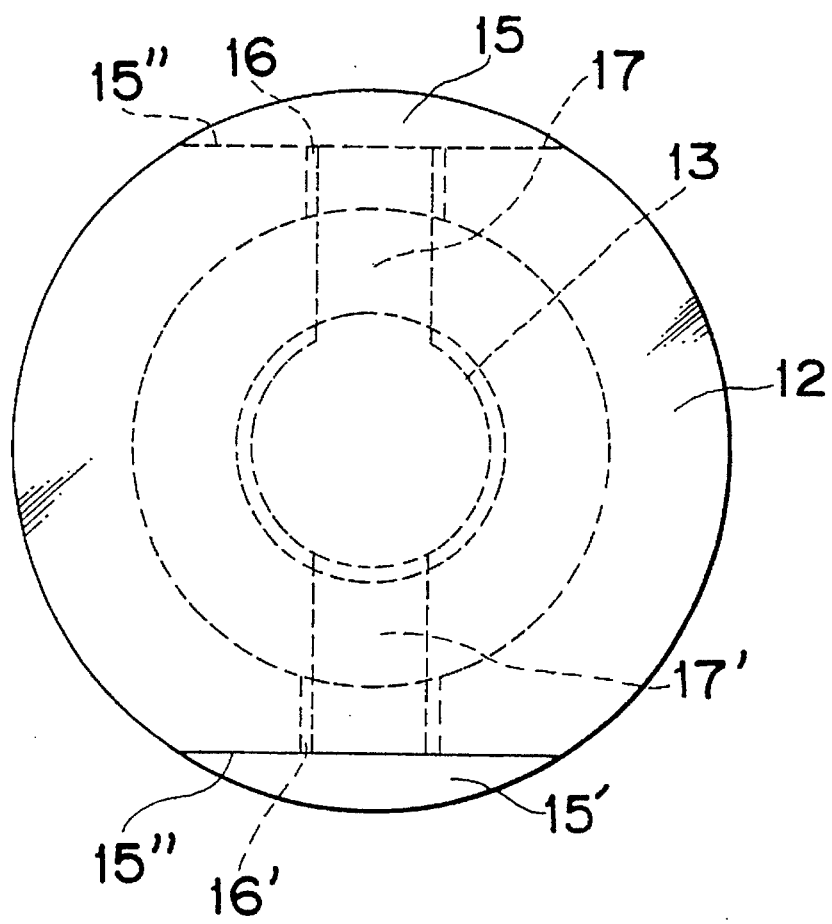
FIG. 4(b) is a plan view of the piezoelectric vibrator of FIG. 4(a)

FIGS. 4(a) and (b) show a fourth example of a structure of a piezoelectric vibrator wherein reference numerals 11–17 denote parts having names and functions similar to the piezoelectric vibrator shown in FIGS. 2(a) and (b). FIG. 4(a) shows a section of the structure of this example while FIG. 4(b) is a top view of the structure shown in FIG. 4(a). The piezoelectric vibrator shown in FIGS. 4(a) and (b) differs from that shown in FIGS. 2(a) and (b) as to the structure of the piezoelectric plate 11. The piezoelectric plate 11 comprises a thin portion 11' for generating vibrations at the center and a thick portion 11" around the thin portion 11'. The thin portion 11' further comprises a vibration portion 9 and a thin portion 9' thinner than the vibration portion 9 and provided around the vibration portion 9. Thus, vibration energy can be confined more in the vibration portion 9, while advantages similar to those of Embodiment 2 are available. The Q of resonance increases further and the undesirable, spurious mode can be reduced. The reduction of the spurious mode can be realized if the thin portion 9' is thinner than the vibration portion 9.

Embodiment 5

Figure 5A:
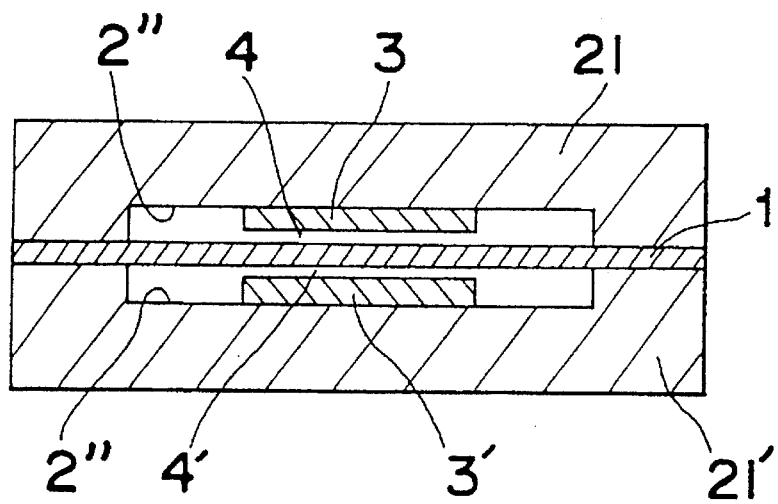
FIG. 5(a) is a schematic sectional view of a fifth example of a piezoelectric vibrator of the present invention.
Figure 5B:
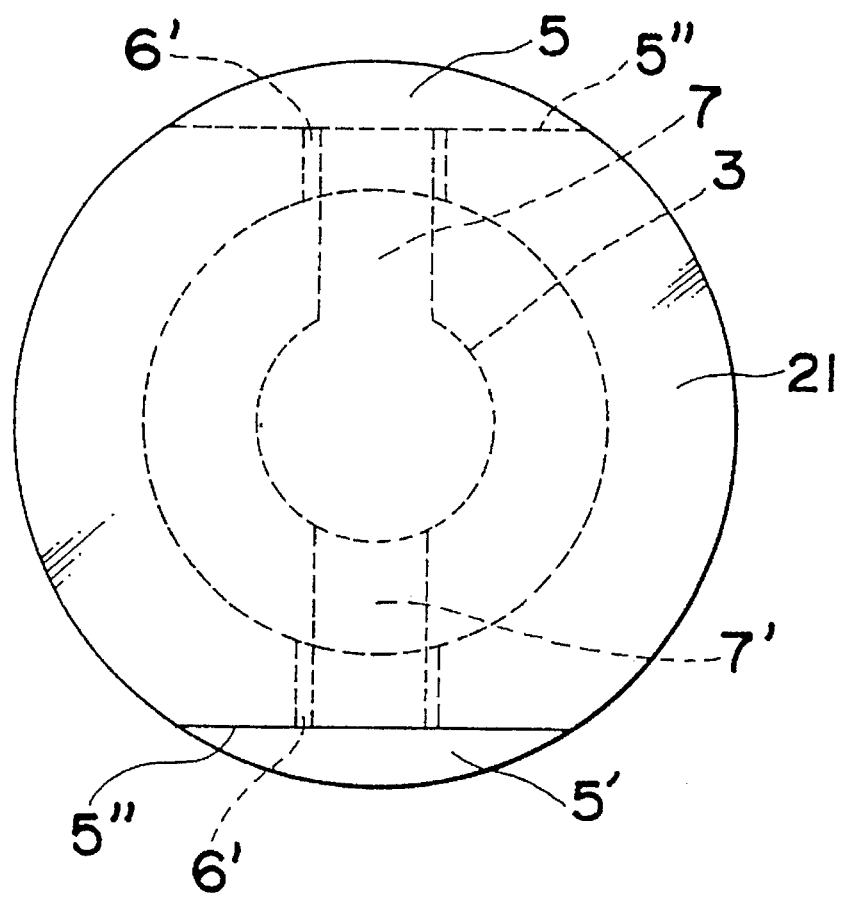
FIG. 5(b) is a plan view of the piezoelectric vibrator of FIG. 5(a)

FIGS. 5(a) and (b) show a fifth example of a structure of a piezoelectric vibrator, wherein reference numerals 1–7 denote parts having names and functions similar to the piezoelectric vibrator shown in FIGS. 1(a) and (b). FIG. 5(a) shows a section of the structure of Embodiment 5 while FIG. 5(b) is a top view of the structure shown in FIG. 5(a). This structure is the same as that of Embodiment 1 shown in FIGS. 1(a) and (b) except for the material of the supporters 21, 21'. The supporters 21, 21' for supporting the electrodes 3, 3' have the same shape as the supporters 2, 2' in FIGS. 1(a) and (b), but they are made of silicon or glass instead of quartz. Because the silicon comprises silicon atoms as a constituent element and the glass comprises silicon and oxygen atoms as main constituent elements, the direct bonding can be performed as in Embodiment 1. Therefore, a structure similar to that shown in FIGS. 1(a) and (b) can be obtained and good high frequency characteristics can be realized.

Next, an example of a manufacturing method is explained. The process explained in Embodiment 1 is carried out by using silicon wafer or glass instead of quartz for the plates for supporting the electrodes. Because the silicon wafer includes silicon as a constituent element and the glass includes silicon and oxygen as main constituent elements, the direct bonding is possible by using the process for hydrophilic treatment with hydrofluoric acid etchant and pure water and heat treatment as in Embodiment 1. Therefore, a structure similar to that in Embodiment 1 can be produced and good high frequency characteristics can be realized.

Further, a structure and characteristics similar to those in Embodiment 2 can also be obtained in a similar manner. That is, the process explained in Embodiment 2 is carried out to form a structure of a piezoelectric vibrator by using silicon wafer or glass instead of quartz for the plates for supporting the electrodes.

Embodiment 6

Figure 6A:
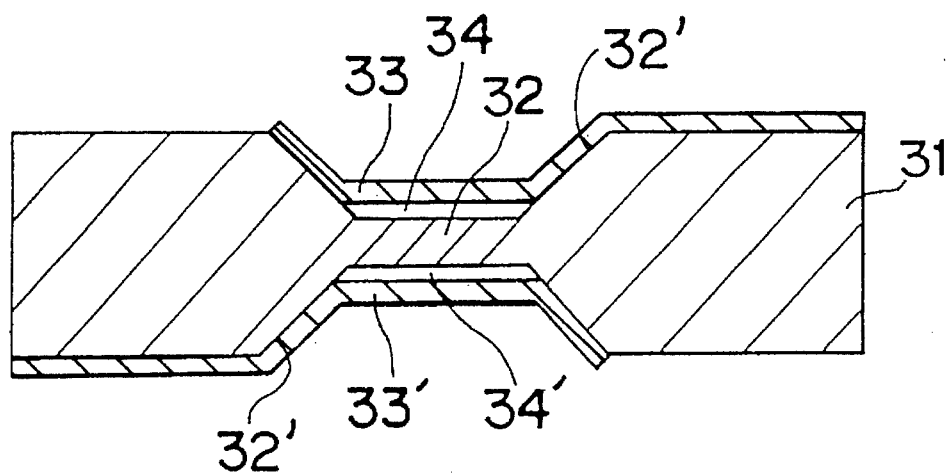
FIG. 6(a) is a schematic sectional view of a sixth example of a piezoelectric vibrator of the present invention.
Figure 6B:
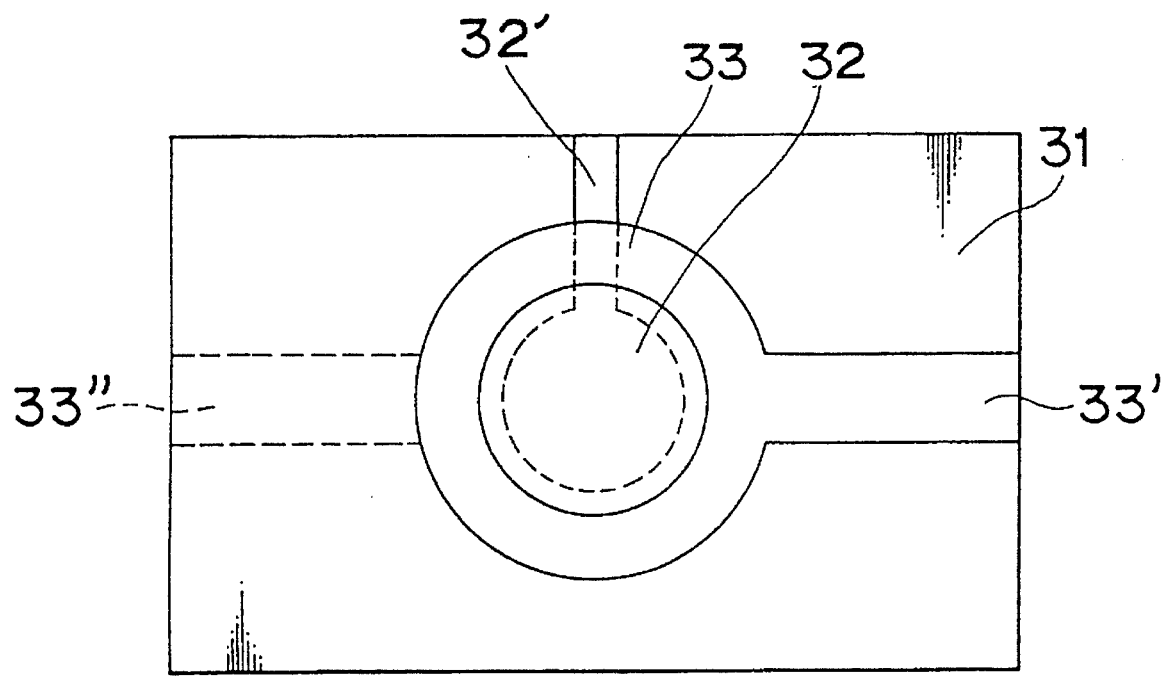
FIG. 6(b) is a plan view of the piezoelectric vibrator of FIG. 6(a)

Different types of non-contact electrodes are used for the piezoelectric vibrators of the examples explained below. FIGS. 6(a) and (b) show a sixth example of a structure of a piezoelectric vibrator. FIG. 6(a) shows a section of the structure of a piezoelectric vibrator, wherein reference numeral 31 denotes a quartz plate comprising a thin plate portion (vibration portion) 32 provided at the center of the quartz plate 31. The quartz plate 31 comprises the thin plate portion 32, a thick portion at the periphery and a shoulder portion 32' between the thin plate portion 32 and the thick portion at the periphery. Non-contact electrodes 33, 33' are formed on opposing sides of the thin plate portion 32 and are supported by the shoulder portion 32', and gaps 34, 34' are provided between the thin plate portion 32 and the non-contact electrodes 33, 33'. The quartz plate 31 comprises further includes a concave portion 32" for forming an exposed portion necessary to etch and remove a material for forming a gap 34, 34', as will be explained later. The non-contact electrodes 33, 33' are opposed to each other across the vibration portion 32, and have connection portions extending in opposite directions from the center to the periphery. The electrodes 33, 33' do not contact directly with the thin plate portion 32 of the quartz plate due to the gaps 34, 34' when the thin plate portion 32 vibrates, and the distance between the electrodes 33, 33' is smaller than the thickness of the thick portion of the quartz plate 31. Therefore, a strong electric field is applied to the thin plate portion 32 when an electric field is applied between the top and bottom electrodes 33, 33'. By using this structure, a quartz vibrator of very good Q of resonance at high frequencies can be produced. For example, if the thick portion of the quartz plate 31 has 40 μm of thickness, the thin plate portion 32 has about 1.7 μm of thickness, the electrodes 33, 33' have 0.5 μm of thickness and the gap 34, 34' have about 1 μm of thickness, about 1 Ghz of resonance frequency and Q of about 950 are realized. On the contrary, if the gaps 34, 34' are not provided, Q decreases to about 200. Thus, the loss at high frequencies can be significantly improved.

Figure 7:
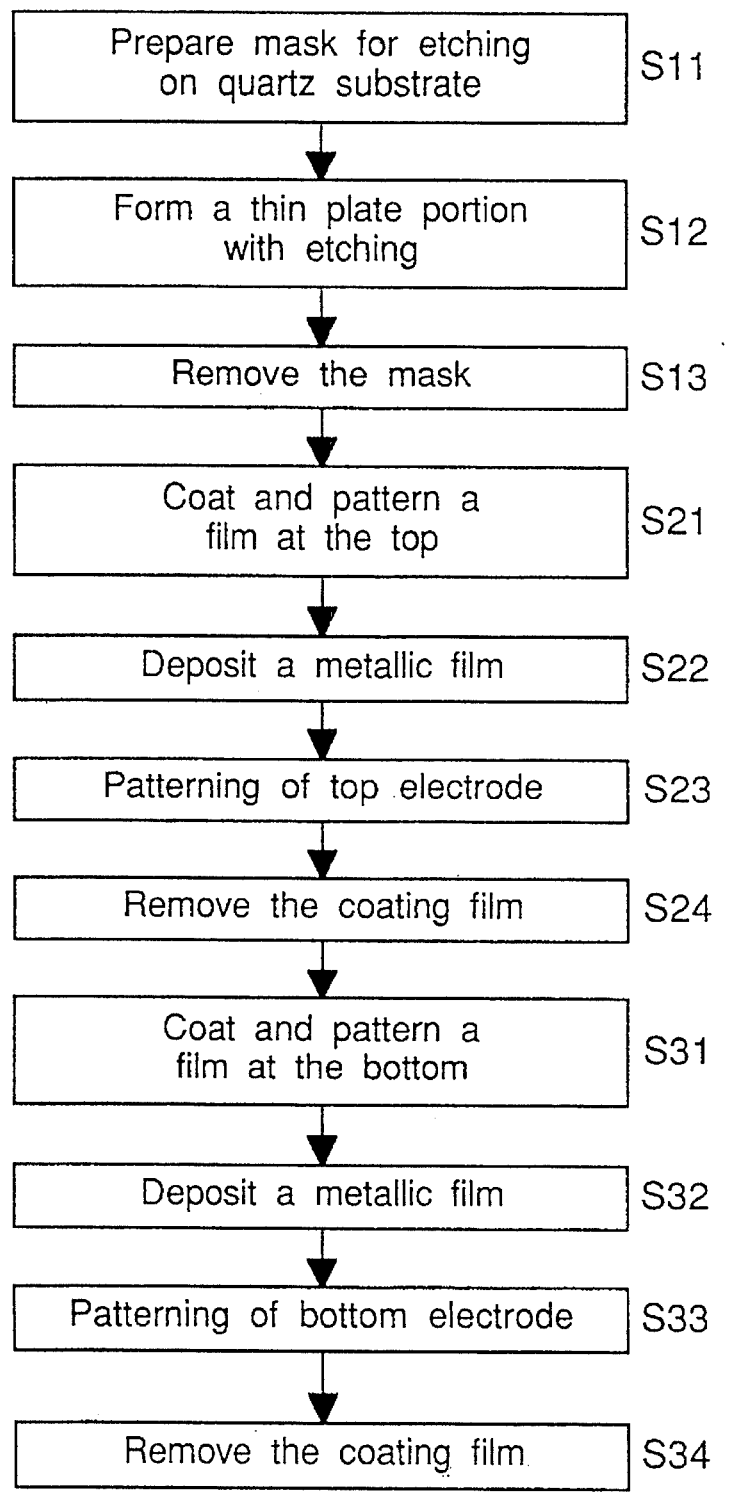
FIG. 7 is a diagram of a manufacturing method of the piezoelectric vibrator shown in FIGS. 6(a) and (b)

Next, an example of a manufacturing method of the piezoelectric vibrator shown in FIGS. 6(a) and (b) is explained below with reference to FIG. 7. First, a quartz plate of 40 μm thickness is provided and the two surfaces of the quartz plate are covered with a mask made of a metallic thin film of chromium-gold or the like except at a portion to be used as a thin plate portion 32 used for vibration (step S11). Then, by using the mask, a thin plate portion 32 is formed in the quartz plate with an etchant of hydrofluoric acid (step S12). By controlling the temperature and the time, the thickness of the thin plate portion 32 can be reduced to for example 2 μm. A shoulder portion 32' is also fabricated. Then, the mask for etching is removed (step S13).

Next, a photosensitive polyimide layer is coated on the entire surface by spin coating, and a polyimide layer is formed on the thin plate portion 32 with a photolithography technique to cover the thin plate portion 32 (step S21). Next, a chromium-gold layer is deposited on the entire surface by vacuum deposition (step S22), and prescribed patterns of electrodes 33, 33' above the thin plate portion 32 and on the shoulder portion 32' and the thick portion at the periphery are formed with conventional photolithography and etching techniques (step S23). In this process, a part of the polyimide film remains exposed, and the polyimide film on the thin plate portion 32 is removed with a solvent of polyimide through the concave portion 32" (step S24). Thus, the electrode 33 and the thin plate portion 32 of quartz do not contact directly, and the electrode 33 is held by the shoulder portion 32'. This process is repeated for the electrode 33' (steps S31–S34), to produce a quartz vibrator as shown in FIGS. 6(a) and (b). The gaps 34, 34' between the thin plate portion 32 and the non-contact electrodes 33, 33' can be controlled to be between 0.1 and 5 μm. The thickness of the electrodes 33, 33' is set for example to be 0.5 μm.

Another example of a manufacturing method of the piezoelectric vibrator shown in FIGS. 6(a) and (b) is explained below. The manufacturing method is the same as that explained above up until the thin plate portion 32 of 2 μm thickness is formed. Then, aluminum is deposited on the entire surface of the quartz plate 31 with a vacuum deposition process, and an aluminum film is formed on the thin plate portion 32 so as to cover the thin plate portion 32 with the use of conventional photolithography and etching techniques. The etchant used is hydrochloric acid or the like. Next, chromium-gold is deposited on the entire surface with vacuum deposition, and prescribed patterns of electrodes 33, 33' above the thin plate portion 32 and on the shoulders and the thick portion at the periphery are formed with conventional photolithography and etching techniques. In this process, a part of the aluminum film remains exposed, and the aluminum film on the thin plate portion 32 is removed with a solvent such as hydrochloric acid which dissolves aluminum but does not dissolve chromium-gold and quartz. Thus, the non-contact electrode 33, 33' and the quartz plate 31 do not contact directly with each other at the thin plate portion 32, and the electrode 33, 33' is held by the shoulder portion 32' of the quartz plate 31. This process is repeated on the two surfaces to produce a quartz vibrator as shown in FIGS. 6(a) and (b). The gaps 34, 34' between the thin plate portion 32 and the non-contact electrodes 33, 33' can be controlled to be between 0.1 and 5 μm. The thickness of the chromium-gold electrodes 33, 33' can be set between 0.1 and 5 μm, for example at 0.5 μm.

Embodiment 7

Figure 8:
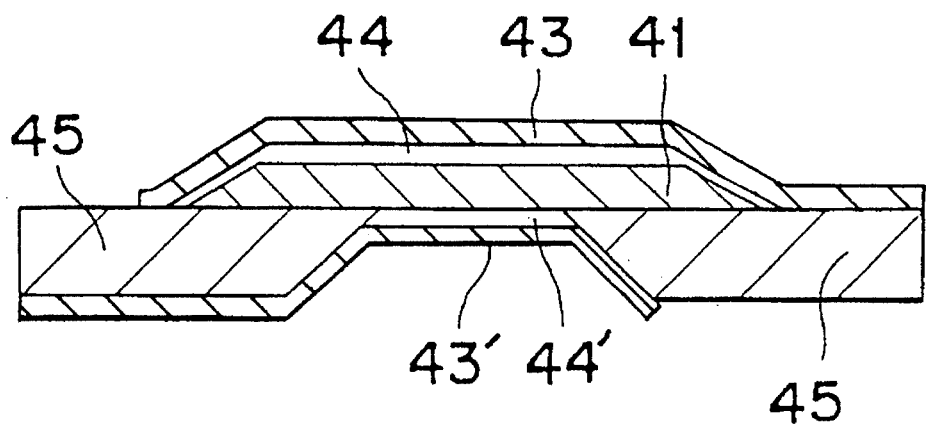
FIG. 8 is a schematic sectional view of a seventh example of a piezoelectric vibrator of the present invention.

FIG. 8 shows a seventh example of a structure of a piezoelectric vibrator, wherein reference numeral 41 denotes a thin quartz plate used to generate vibrations, reference numerals 43, 43' denote non-contact electrodes, and reference numeral 45 denotes a supporter, made of quartz, silicon or glass for supporting the electrodes 43, 43'. The supporter 45 having an opening at the center is bonded directly to the quartz plate 41. The electrode 43 is formed above the entire quartz plate 41, while the other electrode 43' is formed on the other side of and spaced apart from the quartz plate 41 in the above-mentioned opening of the supporter 45. Thus, the electrodes 43, 43' are opposed to each other across the quartz plate 41. Reference numerals 44, 44' denote gaps between the quartz plate 41 and the electrodes 43, 43', and the electrodes 43, 43' do not contact directly with the quartz plate 41 due to the gaps 44, 44' when the quartz plate 41 vibrates. Therefore, a strong electric field is applied to the quartz plate 41 when an electric field is applied between the top and bottom electrodes 43, 43'. By using this structure, a quartz vibrator of very good Q of resonance at high frequencies can be provided. As an example, if sizes similar to those in Embodiment 6 are used, about 1 GHz of resonance frequency and Q of about 950 are realized. On the contrary, if the gaps 44, 44' are not provided for the electrodes, Q decreases to about 200. Thus, the loss at high frequencies can be significantly improved.

Figure 9:
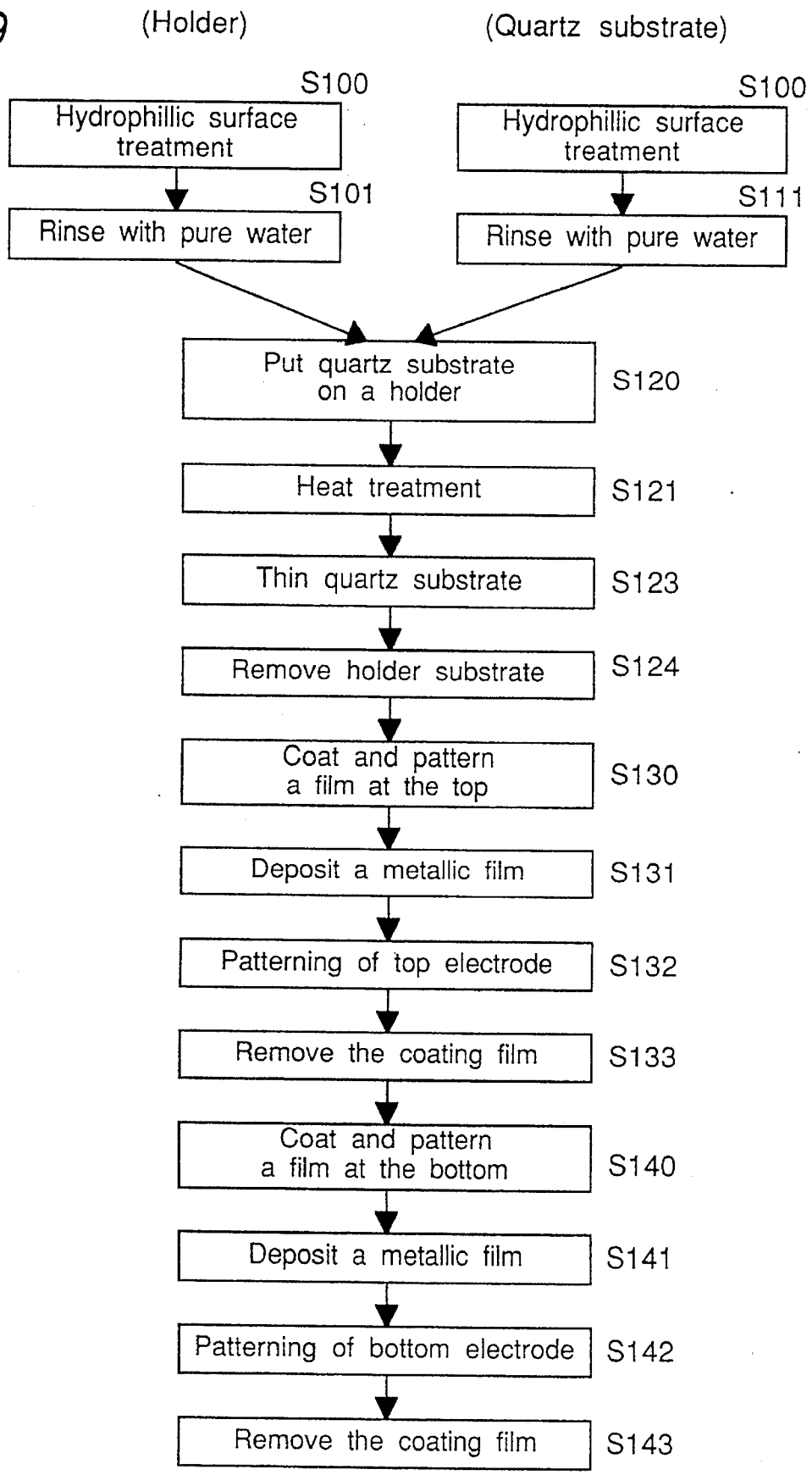
FIG. 9 is a diagram of a manufacturing method of the piezoelectric vibrator shown in FIG. 8.

An example of a manufacturing method of a piezoelectric vibrator shown in FIG. 8 is explained below with reference to FIG. 9. First, a quartz plate of a thickness of 40 μm and a supporter 45 made of quartz, glass or silicon wafer are provided, and they are bonded directly with each other. That is, first, the surfaces of the quartz plate and the supporter 45 are made hydrophilic (steps S101 and S111), and they are immersed in pure water (steps S102 and S112). Then, they are layered (step S120) and heated at 300°–500° C. in air to complete the direct bonding (step S121). Next, the supporter 45 is masked with a chromium-gold layer, and only the quartz plate is etched to 2 μm of thickness to form the quartz plate 41 (step S122). Then, the supporter 45 just below the quartz plate 41 is etched with conventional photolithography and etching techniques from the side not bonded with the quartz plate 41 to expose the rear plane of the quartz plate 41 to form a hole at the center of the supporter 45 (step S123). If the supporter 45 is made of silicon, the etchant used is a mixed acid of hydrofluoric acid with nitric acid, potassium hydroxide or the like. If the supporter 45 is made of quartz or glass, the etchant used is a hydrofluoric acid. Then, the entire surface of the quartz plate 41 is coated with a photosensitive polyimide film by spin coating. Next, processes (steps S130–S133 and steps S140–S143) similar to the above-mentioned example (steps S21–S24 and steps S31–S34) are used to complete a structure shown in FIG. 8, wherein the non-contact electrodes 43, 43' do not contact with a portion of the quartz plate 41 during vibration.

Embodiment 8

Figure 10:
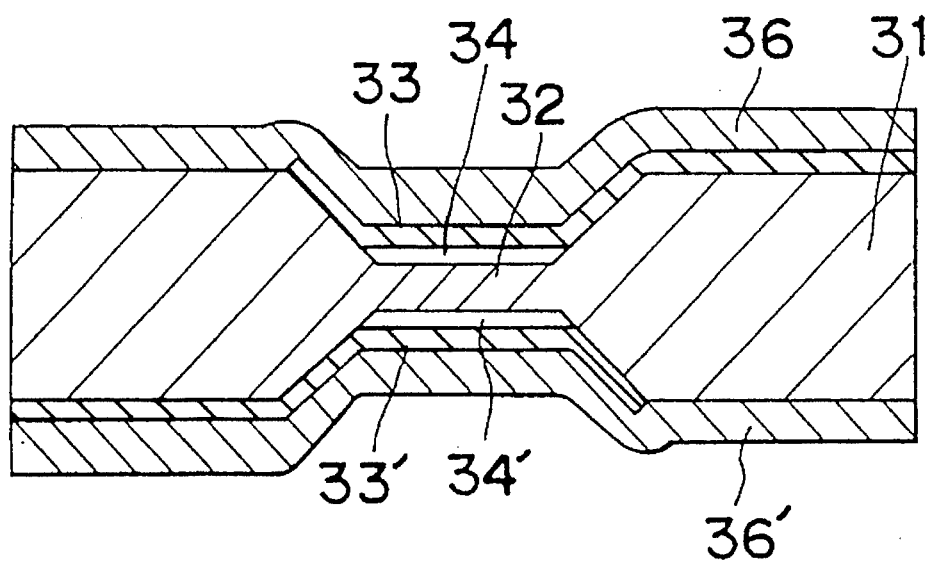
FIG. 10 is a schematic sectional view of an eighth example of a piezoelectric vibrator of the present invention.

FIG. 10 shows an eighth example of a piezoelectric vibrator, wherein reference numerals 31–34 denote parts having names and functions similar to the piezoelectric vibrator of Embodiment 6 shown in FIGS. 6(a) and (b). Reference numerals 36, 36' denote reenforcing layers formed over the whole surface at both sides including the non-contact electrodes 33, 33'. By using this structure, the strength of the non-contact electrodes 33, 33' is increased by the reinforcing layers 36, 36', and the mechanical reliability against dropping, vibrations or the like is significantly improved to a large extent, while keeping the high frequency characteristics as in Embodiment 6. The reinforcing layers 36, 36' may be made of for example a thermosetting film of an organic polyimide resin or a metallic plating film of gold or the like.

Next, an example of a manufacturing method for the piezoelectric vibrator shown in FIG. 10 is explained. The process for manufacturing the piezoelectric vibrator shown in FIGS. 6(a) and (b) is performed as explained in Embodiment 6. The thin plate portion 32 has been coated with a chromium-gold layer. Next, the thickness of the chromium-gold layer is increased with gold plating for example up to 10 μm. Then, the polyimide film is removed. Thus, the mechanical strength of the electrodes 33, 33' is reinforced for the structure shown in FIG. 8. The thickness of the reinforcing layer 36, 36' can be increased further by suitably selecting a material for the plating and a plating process. For example, it can be increased easily to 30 μm by using nickel plating.

Embodiment 9

Figure 11:
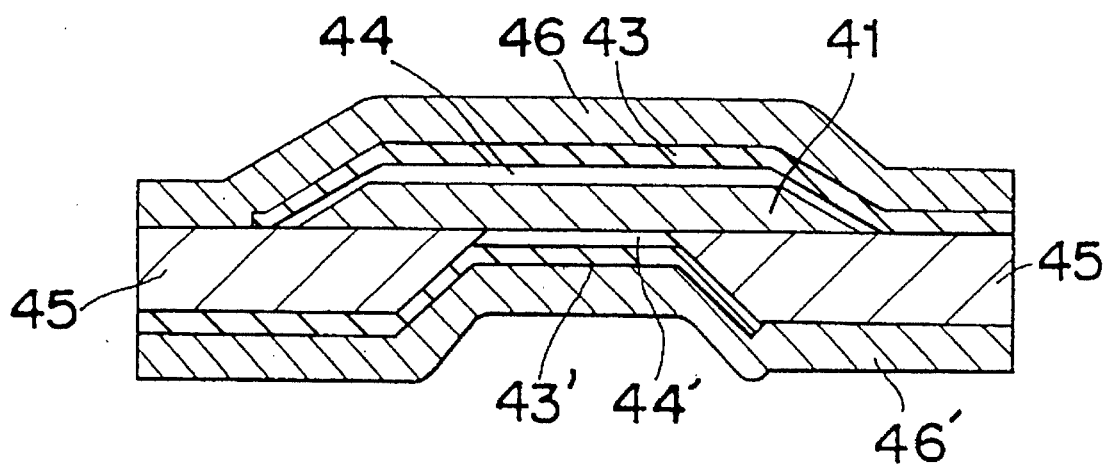
FIG. 11 is a schematic sectional view of a ninth example of a piezoelectric vibrator of the present invention.

FIG. 11 shows a ninth example of a structure of a piezoelectric vibrator, wherein reference numerals 41–45 denote parts having names and functions similar to Embodiment 7 shown in FIG. 8. Reinforcing layers 46, 46' are applied to the non-contact electrodes 43, 43'. By using this structure, the mechanical reliability against dropping, vibrations or the like can be significantly improved, while keeping the high frequency characteristics as in Embodiment 7. The reenforcing layers 46, 46' may be made of for example a thermosetting film of an organic polyimide resin or a metallic plating film of gold or the like, as in Embodiment 8.

Next, an example of a manufacturing method for the piezoelectric vibrator shown in FIG. 11 is explained. The processes of the manufacturing method of the piezoelectric vibrator shown in FIG. 8 are carried out until the chromium-gold film for the electrodes 43, 43' are formed. Next, a photosensitive polyimide film is coated on the entire surface at both sides of the piezoelectric vibrator. Then, the polyimide film and the chromium-gold layer are processed with the conventional photolithography and etching to form the prescribed pattern of electrodes 43, 43'. Then, the polyimide film is set thermally and the aluminum is removed by etching to form gaps, to complete the quartz vibrator shown in FIG. 11. Thus, the mechanical strength of the non-contact electrodes 43, 43' is reinforced by the polyimide layer 46, 46'.

Next, another example of a manufacturing method for the piezoelectric vibrator shown in FIG. 11 is explained. Similar to the above-mentioned method, the processes of the above-mentioned method are carried out until the chromium-gold electrode 43, 43' are formed. Next, a photosensitive polyimide film 46, 46' is coated except for a small exposed area of the aluminum for forming gaps later. Then, the polyimide film is set thermally and the aluminum is removed by etching to form gaps 44, 44' from the exposed area. Thus, the mechanical strength of the non-contact electrodes 43, 43' is reinforced with the polyimide layer 46, 46'. Thus, the quartz vibrator shown in FIG. 11 is obtained.

Embodiment 10

Figure 12:
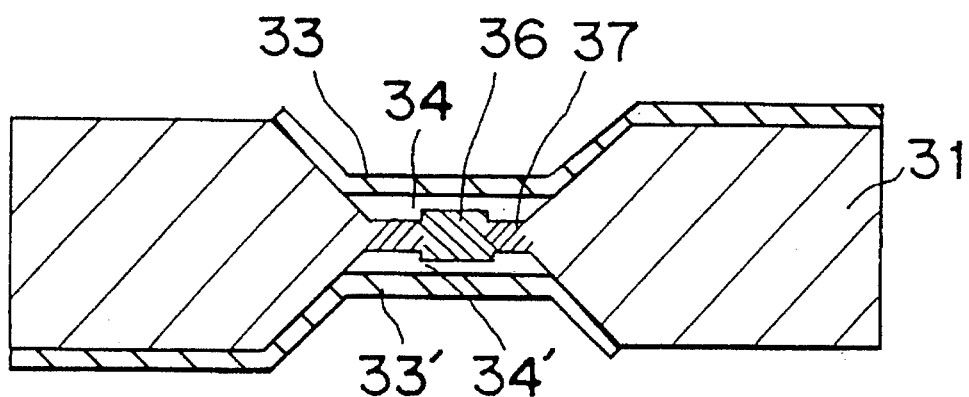
FIG. 12 is a schematic sectional view of a tenth example of a piezoelectric vibrator of the present invention.

FIG. 12 shows a tenth example of a piezoelectric vibrator. This piezoelectric vibrator is different from that shown in FIGS. 6(a) and (b) as to the structure of the quartz plate 31. The quartz plate 31 comprises a vibration portion 36 and a thin portion 37 around the vibration portion 36. The vibration portion 36 is thicker than the thin portion 37. Reference numerals 33 and 34 denote the same structure as in FIG. 6(a). By using this structure, vibrating waves in the quartz plate attenuate rapidly in the thin portion 37 so that the Q of resonance is improved further and the spurious mode is reduced. These advantages can be obtained if the thickness of the thin portion 37 is selected to be thinner by 10% or more than the vibration portion 36.

In order to manufacture this structure of the piezoelectric vibrator, the manufacturing method of the piezoelectric vibrator of Embodiment 6 is modified. That is, after the thin quartz portion 32 is formed, the thickness of the periphery of the thin portion 32 is further reduced using photolithography and etching to form the thin portion 37 while retaining the vibration portion 36.

Embodiment 11

Figure 13:
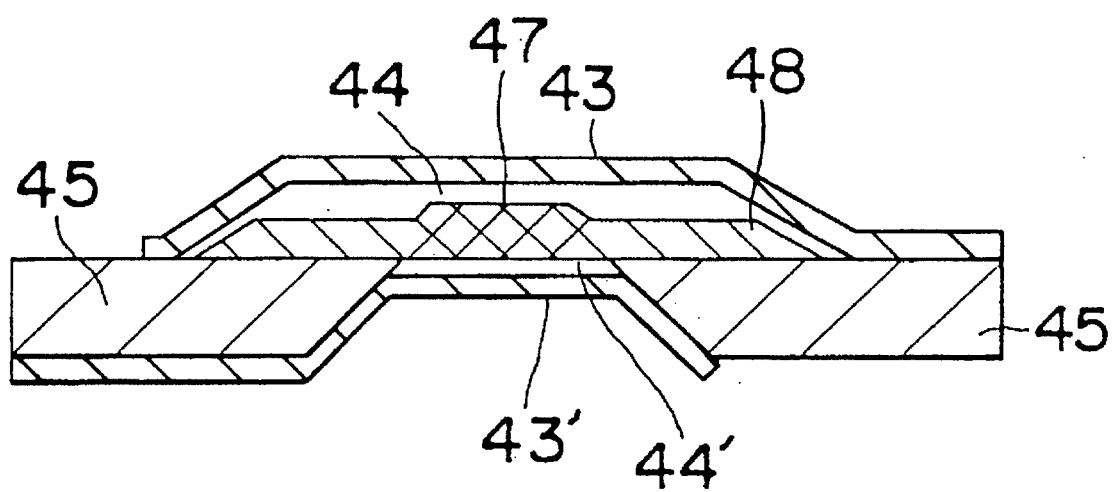
FIG. 13 is a schematic sectional view of an eleventh example of a piezoelectric vibrator of the present invention.

FIG. 13 shows an eleventh example of a piezoelectric vibrator. This piezoelectric vibrator is the same as that of Embodiment 7 shown in FIG. 8 except that the quartz plate 41 comprises a vibration portion 47 and a thinner portion 48 around the vibration portion 47. Reference numerals 43, 44 and 45 denote the same structure as in FIG. 8. The thickness of the vibration portion 47 is larger than that of the thinner portion 48 around the vibration portion 47. By using this structure, vibrating waves in the quartz plate attenuate rapidaly in the thinner portion 48 so that the Q of resonance is improved further and the spurious mode is reduced. The advantages can be obtained if the thickness of the peripheral thinner portion 48 is selected to be thinner by 10% or more than that of the central vibration portion 47.

In order to manufacture this structure of the piezoelectric vibrator, the manufacturing method in Embodiment 7 is modified. That is, after the thickness of the quartz plate is reduced, the periphery of the quartz plate is further formed thinner using photolithography and etching.

The above-mentioned examples are explained further below. The improvement of Q at high frequencies is remarkable if the thickness of the quartz plate is 10 μm or less. The thickness at the vibration portion of the quartz plate is not limited to the 4 μm thickness adopted in Embodiments 1–5 or the 2 μm thickness adopted in Embodiments 6–11. However, if the thickness of the quartz vibration portion exceeds 10 μm, the advantages of the non-contact electrodes become small. Therefore, it is preferable that the thickness of the quartz vibration portion is 10 μm or less.

The initial thickness of the quartz plate is not limited to the 40 μm thickness as adopted in the examples; it may be thicker or thinner than 40 μm so long as the handling is not hindered.

The gap between the thin quartz plate and the non-contact electrode has a thickness of 1 μm. However, by controlling the vacuum deposition or the etching for forming the thin quartz plate, the gap can be made larger or smaller within the range of 0.1–5 μm. The gaps for the non-contact electrodes can be formed with good reproducibility by using wet etching, pin coating, vacuum deposition and the like. The intensity of the electric field increases upon decreasing the thickness of the gap, while it is necessary to increase the gap to overcome the bending of the electrodes when the area of the vibration portion is wide. Practically, a thickness up to 5 μm is sufficient for such a case.

The Q of resonance does not decrease so low at high frequencies due to electrode loss because the gaps are formed between the piezoelectric vibration portion and the non-contact electrodes so that they do not directly contact with each other, and the high frequency characteristics can be significantly improved to a large extent.

Further, the direct bonding is used for connection by using quartz both for the vibration portion and for the supporters such as explained in Embodiments 1 and 2, and the thermal expansion coefficients of the vibration portion and the supporter can be chosen to be the same, so that a very stable element against temperature can be obtained. Even if glass is used for the supporters as in Embodiment 5, it is relatively easy to select a glass material for the piezoelectric vibrator having a thermal expansion coefficient similar to the vibration portion because the range of thermal expansion coefficients for a glass is wide. Therefore, the stability of the characteristics against temperature is improved by the direct bonding of the piezoelectric plate with materials having the same or a similar thermal expansion coefficients. Further, if silicon is used for the supporters, the thin quartz plate can be easily formed by etching, and the productivity for the quartz vibrator is improved.

Because direct bonding without an adhesive agent is used, the precision of the gap is high, and the bonding is stable for etching and heat treatment. Thus, the direct bonding is superior and increases productivity.

In the above-mentioned Examples 1–11, the electrodes are made of chromium-gold layers (for example successive layers of a chromium layer of 0.02 μm thickness and a gold layer of 0.48 μm thickness), and the thickness thereof is for example 2 μm. On the other hand, the electrodes may also be made of an ordinary metal such as titanium, platinum, copper, silver, tungsten or nickel. Aluminum can also be used if aluminum is not used for forming the gap. The thickness of the electrodes can be controlled to be between 0.1–5 μm with vacuum deposition.

In the Embodiments 6–11, a photosensitive polyimide of an organic material and aluminum of an inorganic material are used for forming the gaps between the quartz vibration plate and the electrodes. However, any material can be used which does not dissolve the quartz, the electrodes and the supporter, but dissolves itself with a solvent or an etchant. For example, an organic material such as a conventional photoresist, an oxide such as silicon oxide, a nitride such as silicon nitride and a metal such as titanium or chromium can be used.

By using the reinforcing layer as in Embodiments 8 and 9, the mechanical reliability against dropping or the like can be improved while maintaining good high frequency resonance characteristics.

Though quartz is used for the piezoelectric plate in the above-mentioned Embodiments, a similar structure and non-contact electrodes can be realized for another piezoelectric material if an adhesive is used for bonding with the supporters. For example, a similar structure and advantages can be realized for lithium niobate, lithium tantalate, zinc oxide or lithium borate.

Further, though quartz, silicon wafer or glass is used for the supporters in the above-mentioned Embodiments, similar advantages of non-contact electrodes can be realized for a different material as far as an adhesive is used for bonding with the supporters.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A piezoelectric vibrator comprising:

a piezoelectric plate made of quartz and including a vibration portion and an electrode-supporting portion;

a pair of electrodes supported directly on said electrode-supporting portion of said piezoelectric plate on opposite sides of said piezoelectric plate;

wherein said electrodes are separated from said vibration portion of said piezoelectric plate such that gaps are formed on opposite sides of said vibration portion of said piezoelectric plate between said vibration portion of said piezoelectric plate and said electrodes, respectively;

wherein said electrode-supporting portion includes a thick portion having a thickness greater than a thickness of said vibration portion;

wherein said electrode-supporting portion further includes a transition portion integrally connecting between said thick portion and said vibration portion, said transition portion gradually narrowing from said thick portion to said vibration portion; and wherein said electrodes are supported directly on said transition portion of said electrode-supporting portion so as to span across said vibration portion with said gaps formed between said vibration portion and said electrodes, respectively.

2. A piezoelectric vibrator as recited in claim 1, wherein said electrodes constitute a means for applying an alternating electric field across said piezoelectric plate to cause said vibration portion of said piezoelectric plate to vibrate.

3. A piezoelectric vibrator as recited in claim 1, wherein said vibration portion has a thickness of between 0.1 and 10 microns.

4. A piezoelectric vibrator as recited in claim 1, wherein said gaps between said electrodes and said vibration portion of said piezoelectric plate are between 0.1 and 5 microns each.

5. A piezoelectric vibrator as recited in claim 1, wherein said vibration portion of said piezoelectric plate includes a central portion and a peripheral portion about said central portion, said peripheral portion being thinner than said central portion, whereby any vibration of said vibration portion is concentrated in said central portion.

6. A piezoelectric vibrator comprising:

a piezoelectric plate made of quartz and including a vibration portion and an electrode-supporting portion;

a pair of electrodes supported directly on said electrode-supporting portion of said piezoelectric plate on opposite sides of said piezoelectric plate;

wherein said electrodes are separated from said vibration portion of said piezoelectric plate such that gaps are formed on opposite sides of said vibration portion of said piezoelectric plate between said vibration portion of said piezoelectric plate and said electrodes, respectively;

a thickness of said vibration portion is less than a thickness of said electrode-supporting portion;

wherein said vibration portion of said piezoelectric plate constitutes a bottom of each of a pair of opposed recesses formed in said piezoelectric plate; and wherein said electrodes are shaped to substantially conform to said recesses, respectively, with said gaps respectively formed between said electrodes and said vibration portion of said piezoelectric plate.

7. A piezoelectric vibrator as recited in claim 6, wherein said electrodes constitute a means for applying an alternating electric field across said piezoelectric plate to cause said vibration portion of said piezoelectric plate to vibrate.

8. A piezoelectric vibrator as recited in claim 6, wherein said vibration portion has a thickness of between 0.1 and 10 microns.

9. A piezoelectric vibrator as recited in claim 6, wherein said gaps between said electrodes and said vibration portion of said piezoelectric plate are between 0.1 and 5 microns each.

10. A piezoelectric vibrator as recited in claim 6, wherein said vibration portion of said piezoelectric plate includes a central portion and a peripheral portion about said central portion, said peripheral portion being thinner than said central portion, whereby any vibration of said vibration portion is concentrated in said central portion.

11. A piezoelectric vibrator comprising:

a piezoelectric plate made of quartz and including a vibration portion and an electrode-supporting portion;

a pair of electrodes supported directly on said electrode-supporting portion of said piezoelectric plate on opposite sides of said piezoelectric plate;

wherein said electrodes are separated from said vibration portion of said piezoelectric plate such that gaps are formed on opposite sides of said vibration portion of said piezoelectric plate between said vibration portion of said piezoelectric plate and said electrodes, respectively; and wherein a reinforcing layer is formed over each of said electrodes for increasing a mechanical strength thereof.

12. A piezoelectric vibrator as recited in claim 11, wherein said electrodes constitute a means for applying an alternating electric field across said piezoelectric plate to cause said vibration portion of said piezoelectric plate to vibrate.

13. A piezoelectric vibrator as recited in claim 11, wherein a thickness of said vibration portion is less than a thickness of said electrode-supporting portion.

14. A piezoelectric vibrator as recited in claim 11, wherein said piezoelectric plate gradually narrows from said electrode-supporting portion toward said vibration portion.

15. A piezoelectric vibrator as recited in claim 11, wherein said vibration portion has a thickness of between 0.1 and 10 microns.

16. A piezoelectric vibrator as recited in claim 11, wherein said gaps between said electrodes and said vibration portion of said piezoelectric plate are between 0.1 and 5 microns each.

17. A piezoelectric vibrator as recited in claim 11, wherein said vibration portion of said piezoelectric plate includes a central portion and a peripheral portion about said central portion, said peripheral portion being thinner than said central portion, whereby any vibration of said vibration portion is concentrated in said central portion.

* * * * *